United States Patent
Rha et al.

[11] Patent Number: 5,818,067
[45] Date of Patent: Oct. 6, 1998

[54] THIN FILM TRANSISTOR AND METHOD FOR FABRICATING THEREOF

[75] Inventors: Sa Kyun Rha; Young Il Cheon, both of Seoul, Rep. of Korea

[73] Assignee: LG Semicon Co., Ltd., Chungcheongbuk-Do, Rep. of Korea

[21] Appl. No.: 968,863

[22] Filed: Nov. 5, 1997

Related U.S. Application Data

[60] Continuation of Ser. No. 473,241, Jun. 7, 1995, abandoned, which is a division of Ser. No. 246,870, May 20, 1994, abandoned.

[30] Foreign Application Priority Data

May 20, 1993 [KR] Rep. of Korea ............... 8693/1993
Aug. 16, 1993 [KR] Rep. of Korea ............. 15788/1993

[51] Int. Cl.$^6$ .................... H01L 29/04; H01L 31/036; H01L 31/0376; H01L 31/20
[52] U.S. Cl. .................................. 257/57; 257/59
[58] Field of Search .................... 257/57, 59, 66

[56] References Cited

U.S. PATENT DOCUMENTS

| | | |
|---|---|---|
| 4,232,327 | 11/1980 | Hsu . |
| 4,312,680 | 1/1982 | Hsu . |
| 4,313,256 | 2/1982 | Widmann ................ 29/579 |
| 4,318,216 | 3/1982 | Hsu . |
| 5,256,584 | 10/1993 | Hartmann ............... 437/43 |
| 5,286,664 | 2/1994 | Horiuchi ................ 437/44 |
| 5,298,434 | 3/1994 | Strater et al. . |
| 5,324,674 | 6/1994 | Possin et al. . |
| 5,342,798 | 8/1994 | Huang ................... 437/41 |
| 5,348,899 | 9/1994 | Dennison et al. ........ 437/41 |
| 5,352,619 | 10/1994 | Hong . |
| 5,358,879 | 10/1994 | Brady et al. . |
| 5,364,807 | 11/1994 | Hwang ................... 437/44 |
| 5,366,909 | 11/1994 | Song et al. . |
| 5,371,037 | 12/1994 | Yonehara . |
| 5,432,102 | 7/1995 | Cho et al. ............... 437/21 |

FOREIGN PATENT DOCUMENTS

| | | | |
|---|---|---|---|
| 1-191473(A) | 1/1989 | Japan | ............ 437/40 AS |
| 5235351 | 9/1993 | Japan . | |

OTHER PUBLICATIONS

Wolf; "Silicon Process for the VLSI Era, vol. 2: Process Integration"; pp., 212–214, 1990.

Wolf et al., vol. 1, Silicon Processing For The VLSI Era, Lattice Press, 1986, pp. 151–155, 183–191, and 321–323. No month.

"16Mbit SRAM Cell Technologies for 2.0V Operation"; H. Ohkubo, S. Horiba, F. Hayashi, T. Andoh, M. Kawaguchi, Y. Ochi, M.Soeda, H.Nozue, M.Miyamoto, T.Shimizu and T.Sasaki, IEEE Meeting 1991, Washington, D.C., Dec. 8–11, 1991.

"Physics of Semiconductor Devices"; S.M. Sze, Bell Telephone Laboratories, Inc, Murry Hill, New Jersey, Copyright 1969. No month.

"Silicon Process for the VLSI Era, vol. 1: Process Technology"; S.Wolf, Ph.D. and R.N. Tauber, Ph.D., United States Patent and Trademark Office, Feb. 9, 1994.

*Primary Examiner*—Stephen Meier
*Attorney, Agent, or Firm*—Morgan, Lewis & Bockius LLP

[57] ABSTRACT

This invention relates to thin film transistors having a sloped drain region suitable for high integrated elements and the method for fabricating the same. The thin film transistor comprising a substrate, a gate pole formed on the central part of the substrate, a semiconductor layer formed to surround the gate pole on the substrate, a side wall spacer formed at one side of the gate pole on the semiconductor layer, and high density impurity regions formed in the semiconductor layer on both sides of the gate pole. The method for fabricating a TFT comprising steps for forming a gate pole on the central part of a substrate, forming a gate insulation film and a semiconductor layer successively on all over the surface of the substrate, forming a side wall spacer only at one side of the gate pole on the semiconductor layer, and forming high density impurity regions in the semiconductor layer on both sides of the gate by ion injecting impurity ions into the semiconductor layer.

25 Claims, 10 Drawing Sheets

THIN FILM TRANSISTOR AND METHOD FOR FABRICATING THEREOF

This application is a continuation of application Ser. No. 08/473,241, filed Jun. 7, 1995, now abandoned, which was a divisional application of application Ser. No. 08/246,870, filed on May 20, 1994 now abandoned.

FIELD OF THE INVENTION

This invention relates to thin film transistors used as elements of LCD (Liquid Crystal Display) or as load resistors of SRAM (Static Random Access Memory) of over 4M class and to a method for fabricating the same, more particularly to thin film transistors having a sloped drain region suitable for highly integrated elements and methods for fabricating the same.

BACKGROUND OF THE INVENTION

Thin film transistors are used as load resistors of high integrated SRAM elements, or 25 driving elements of LCD. In general, a thin film transistor makes off-current to flow low and on-current flow to high, thus increasing the on/off current ratio, thereby to obtaining good characteristics.

Although an off-current of a conventional offset thin film transistor can be controlled to flow lower than that of a common thin film transistor, the corresponding on-current flows low at the same time, allowing no increase of on/off current ratio.

To increase on-current for increasing on/off current ratio, an LDO (Lightly Doped Offset) TFT has been proposed.

FIGs. 1(a) to 1(d) show a process for fabricating a conventional LDO TFT having an upper gate.

Figure 1A:
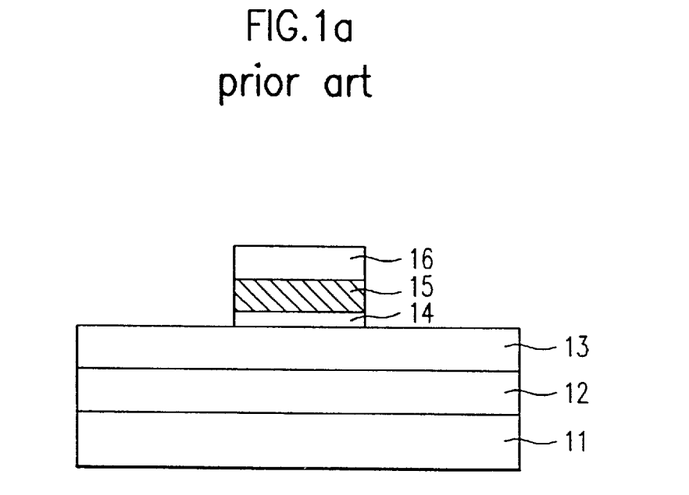

First, as shown in FIG. 1(a), an insulation layer 12 of oxidation film is formed on a substrate 11. On insulation layer 12, a polysilicon film or an amorphous silicon film is deposited, forming a first semiconductor layer 13.

To improve the characteristics of the first semiconductor layer 13, silicon ions are injected into the first semiconductor layer 13. Due to the ion injection of silicon ions, the first semiconductor layer 13 of polysilicon film converts into an amorphous silicon film.

The first semiconductor layer 13 of an amorphous silicon film is laser annealed or annealed at 600 deg. C. ±50 deg. C. for more than 5 hours or to convert into a polysilicon film, again.

Then, to adjust the threshold voltage, impurities are injected into the first semiconductor layer 13.

HTO (High Temperature Oxide) 14 is deposited on the first semiconductor layer 13, on which a polysilicon film 15 is deposited.

The polysilicon film 15 and the HTO film 14 are subjected to a patterning with photo etching process using the photoresist film 16 to form a gate insulation film and a gate electrode.

Figure 1B:
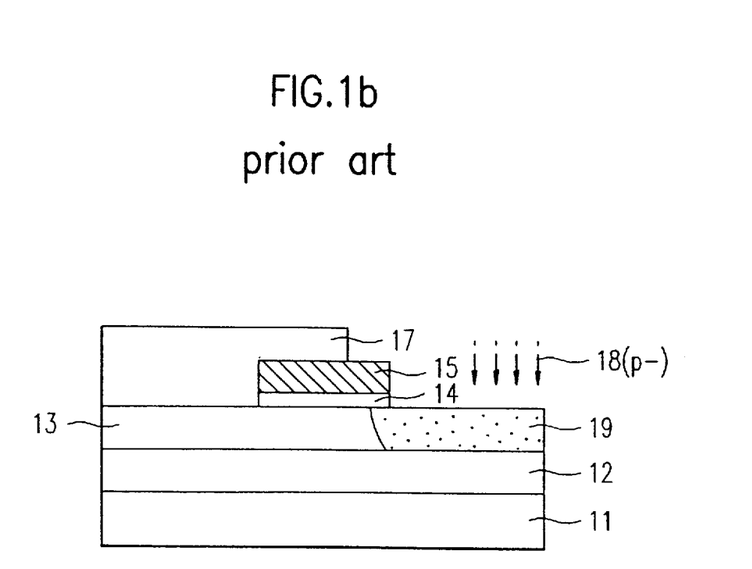

As shown in FIG. 1(b), after removing the photoresist film, another photoresist film 17 is coated on over the surface.

The photoresist film 17 is subjected to photo etching to expose the first semiconductor layer 13 on one side of the gate electrode 15.

The exposed first semiconductor 13 layer is ion injected with p-type impurities 18 using the photoresist film 17 as a mask thereby forming a density drain region 19 in the first semiconductor layer 13.

Figure 1C:
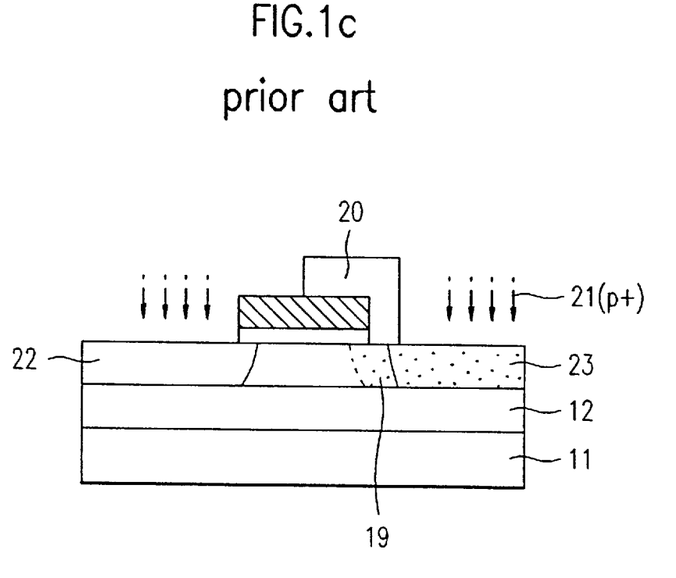

As shown in FIG. 1(c), after removing the photoresist film 17 used for forming the low density drain region 19, another photoresist film 20 is coated on over the surface.

The photoresist film 20 is subjected to a photo etching to expose the part of the first semiconductor layer 13 having low density drain region 19 formed therein on one side of the part of the electrode gate 15 as well as the first semiconductor layer 13 on other side of the gate electrode 15.

The exposed first semiconductor layer 13 is ion injected with p-type impurities 21 using the photoresist film 20 as a mask, forming high density source region 22 in the first semiconductor layer 13 so as to have region 22 overlap with the gate electrode 15, as well as forming high density drain region 23 so as to have region 23 be adjacent to a low density drain region 19 and not overlap with the gate electrode 15.

Figure 1D:
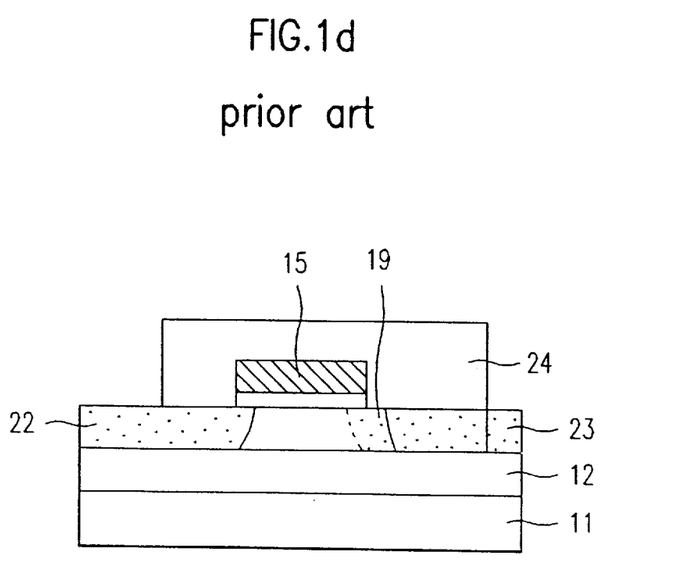

As shown in FIG. 1(d), after removing the photoresist film 20, another photoresist film 24 is coated on all over the surface of the substrate.

Removal of the edges of the high density source and drain regions 22 and 23 with photo etching process using the photoresist film 24 completes a lightly doped offset (LDO) TFT.

FIGS. 2(a) to 2(d) show a process for fabricating an LDO TFT having a bottom gate.

Figure 2A:
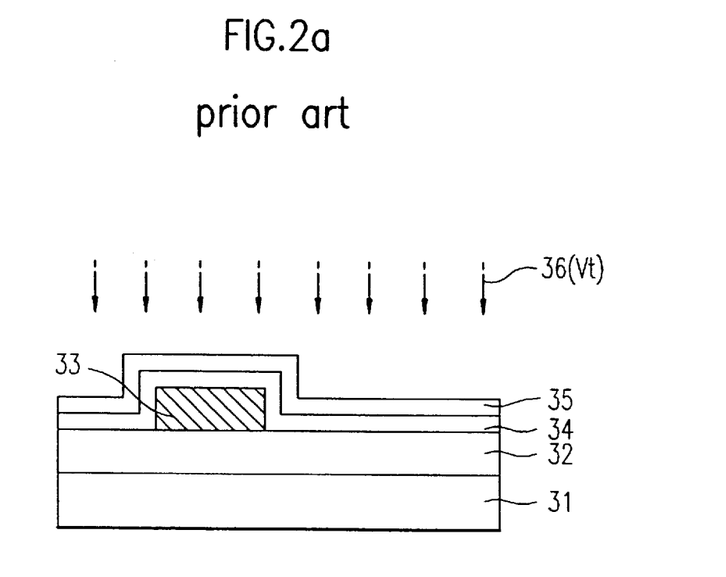

As shown in FIG. 2(a), the substrate 31 is subjected to a deposition of an insulation film 32 and subsequent deposition of a polysilicon film, which are subjected to a photo etching process using a photo mask to form a gate electrode 33.

BTO (High Temperature Oxide) is deposited all over the surface of the substrate forming a gate insulation film 34, and a polysilicon film or an amorphous silicon film is deposited on the gate insulation film 34 forming a semiconductor layer 35.

In order to improve characteristics of the semiconductor layer, silicon ions are injected into the semiconductor layer.

At this time, the ion injection into the semiconductor layer 35 makes the polysilicon film semiconductor layer 35 be converted into an amorphous silicon film.

The semiconductor layer 35 converted into an amorphous silicon film is subjected to a laser annealing or an annealing for five hours at a fixed temperature of 600±50 deg. C. converting into a polysilicon film, again.

Then, in order to adjust threshold voltage Vt, impurity ions 16 are injected into the semiconductor layer 35.

At this time, the gate insulation film 34 and the semiconductor layer 35 have steps at the gate part having the same thickness with the gate electrode 33.

Figure 2B:
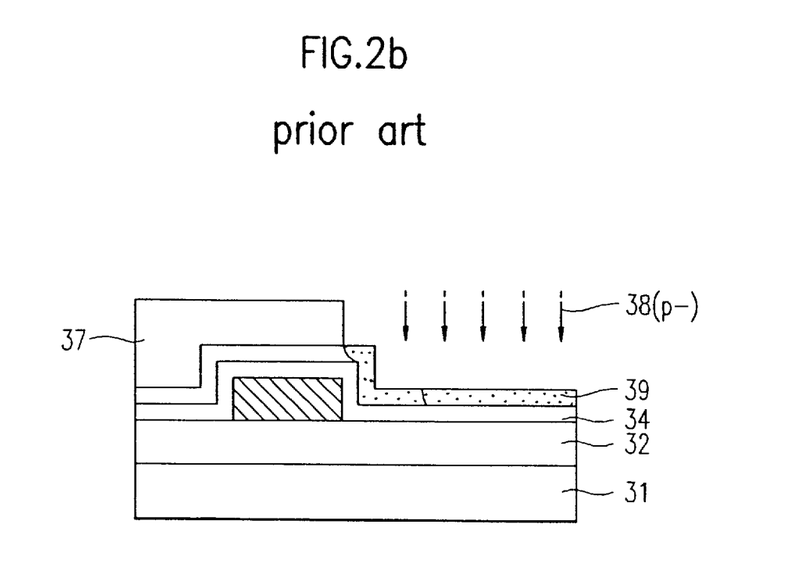

After the foregoing process, as shown in FIG. 2(b), a photoresist film 37 is coated on the semiconductor layer 35, which is subjected to a photo etching to remove the photoresist film 37 on one side of the gate electrode 33 exposing the semiconductor layer 35. P-type impurities 38 are injected using the photoresist film 17 as a mask forming a low density drain region 39.

Figure 2C:
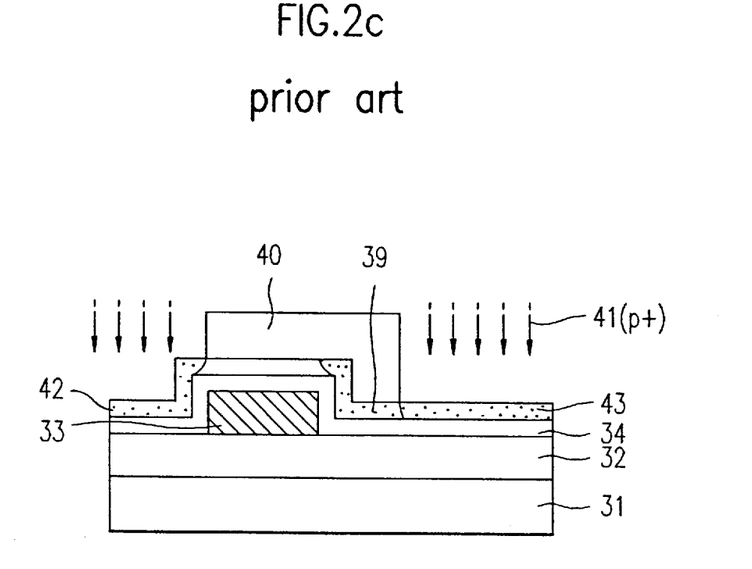

Then, as shown in FIG. 2(c), after removing all the photoresist film 37, another photoresist film 40 is coated again.

A photo etching process is carried out for forming a high density source region and a high density drain region.

That is, the photoresist film 40 is subjected to a photo etching to expose the semiconductor layer 35 on one side of the gate electrode 33 and part of the semiconductor layer 35 having a low density drain region 39 formed therein on the other side of the gate electrode 33.

P-type impurities 41 are ion injected using the photoresist film 40 as a mask forming a high density source region 42 and a high density drain region 43.

As shown in FIG. 2(*d*), after removing the photoresist film 40, another photoresist film 44 is coated, again.

Figure 2D:
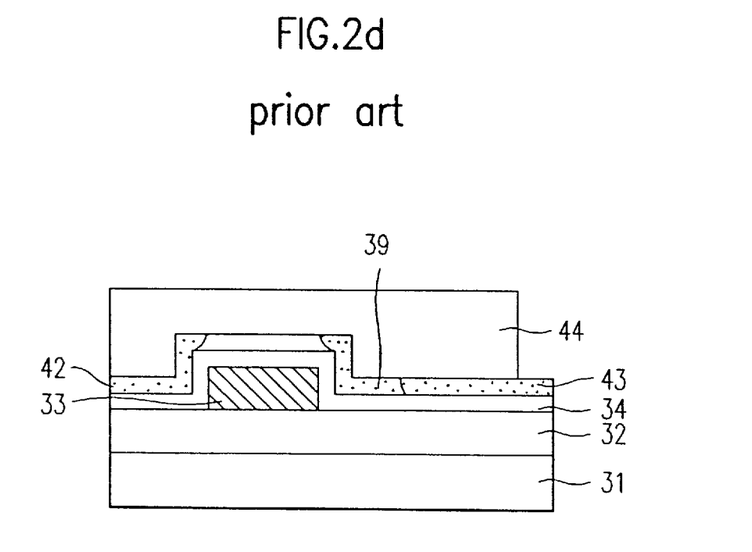

A photo etching process is carried out using the photoresist film 44 patterning the semiconductor layer 35 having the source region 42 and the drain region formed therein, finally completing an LDO TFT.

The object of a lightly doped offset bottom gate thin film transistor explained in foregoing description is to improve electric characteristics of an element by controlling off-current low, making increase on/off current ratio.

However, due to scaling down following high integration of SRAMs and liquid crystal display elements, gate line width at upper part of a TFT gate has become narrower.

Because of this, a problem arises in which decrease of on/off current ratio results in due to increase of off current caused by short channel effects while quantity of on current has no change. And there has been difficulty in the process for fabricating a lightly doped offset bottom gate thin film transistor because over lay margin of mask is narrow at the time of masking for ion injection of low density impurities (P−) as shown in FIG. 2(*b*).

SUMMARY OF THE INVENTION

The object of this invention for solving foregoing problems of prior art is to provide a thin film transistor which can increase on/off current ratio by forming a sloped drain region and a method for fabricating the same.

This and other objects and features of this invention can be achieved by providing a thin film transistor including a substrate, an insulation film formed on the substrate, a gate electrode formed on the central part of the insulation film, a gate insulation film formed on the insulation film surrounding the gate electrode, a semiconductor layer formed on the gate insulation film, a side wall spacer formed at one side of the gate electrode on the semiconductor layer, and high density impurity regions formed in the semiconductor layer on both sides of the gate electrode and having a sloped junction structure under the side wall spacer only on one side thereof. And these and other objects and features of this invention can be achieved by providing a method for fabricating a TFT including steps for forming a gate electrode on the central part of a substrate, forming a gate insulation film and a semiconductor layer successively on all over the surface of the substrate, forming a side wall spacer only at one side of the gate electrode on the semiconductor layer, and forming high density impurity regions in the semiconductor layer on both sides of the gate by ion injecting impurity ions into the semiconductor layer.

Also, this and other objects and features of this invention can be achieved by a TFT including a substrate, a first insulation film formed on the substrate, a semiconductor layer formed on the first insulation film, a gate insulation film formed on the central part of the semiconductor layer, a gate electrode formed on the gate insulation film, a second insulation film formed on the semiconductor layer surrounding the gate electrode, a side wall spacer formed at one side of the gate electrode on the second insulation film, and high density impurity regions formed in the semiconductor layer on both sides of the gate electrode and having a sloped junction structure under the side wall spacer only on one side.

Also, this and other objects and features of this invention can be achieved by providing a method for fabrication a TFT including steps for forming a semiconductor layer on a substrate, forming a gate insulation film and a gate electrode successively on the central part of the semiconductor layer, forming a side wall spacer at one side of the gate electrode on the semiconductor layer, and forming high density impurity regions in the semiconductor layer on both sides of the gate by injection of impurity ions into the semiconductor layer.

BRIEF DESCRIPTION OF THE DRAWINGS

FIGS. 1(*a*) to 1(*d*) show a process for fabricating a lightly doped offset TFT having a conventional upper gate.

FIGS. 2(*a*) to 2(*d*) show a process for fabricating a lightly doped offset TFT having a conventional bottom gate.

FIGS. 4(*a*) to 4(*e*) show a process for fabricating a TFT of FIG. 3.

FIGS. 6(*a*) to 6(*e*) show a process for fabricating a TFT of FIG. 5.

DETAILED DESCRIPTION OF THE INVENTION

Figure 3:
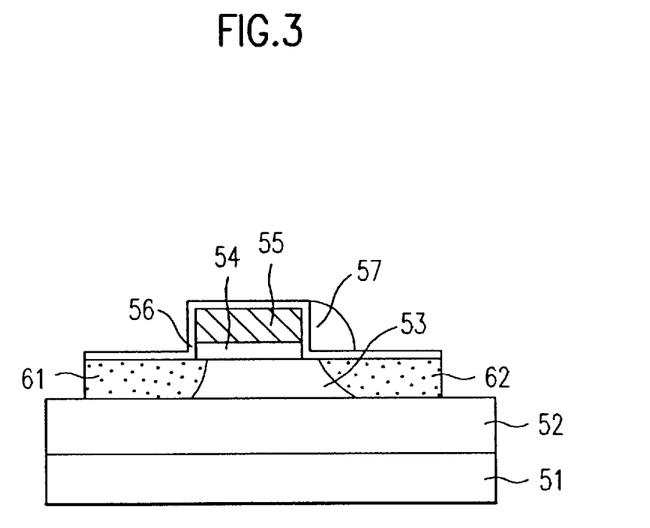
FIG. 3 shows a section of an offset TFT having a upper gate in accordance with one embodiment of this invention.

Shown in FIG. 3 is a section of a TFT having a upper gate in accordance with one embodiment of this invention.

Referring to FIG. 3, a TFT having a upper gate in accordance with this invention includes a substrate 51, a first insulation film 52 formed on the substrate, a semiconductor layer 53 formed on the insulation film except both edges, a gate insulation film 54 form on the central part of the semiconductor layer 53, a gate electrode 55 formed on the gate insulation film 54, a second insulation film 56 formed on the semiconductor layer 53 surrounding the gate electrode 55, a side wall spacer 57 formed at one side of the gate electrode 55 on the second insulation film 56, a high density impurity region 62 for drain having a sloped junction and formed in the semiconductor layer 53 on one side of the gate electrode 55 overlapped with the side wall spacer 57, and a high density impurity region 61 for source formed in the semiconductor layer 53 on the other side of the gate electrode 55 overlapped with the gate electrode 55.

FIGS. 4(*a*) to 4(*e*) show a process for fabricating a TFT shown in FIG. 3.

First, as shown in FIG. 4(*a*), an insulation film 52 of oxidation film is formed on a substrate 51, a semiconductor layer 53 is formed with a coat of undoped polysilicon film or undoped amorphous silicon on the insulation film 52, and an oxidation film and a polysilicon film are coated on the semiconductor layer 53, which are subjected to a patterning to form a gate insulation film 54 and a gate electrode 55 on the central part of the semiconductor layer 53.

Figure 4A:
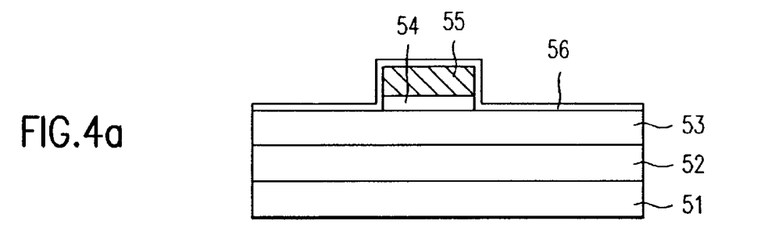
Figure 4B:
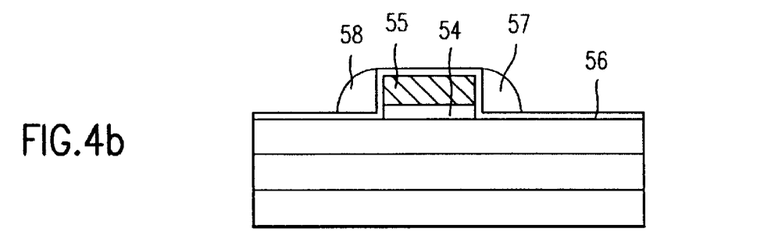

After forming the gate electrode 55, a thin nitride film 56 having a thickness below 1000 Angstroms is deposited on all over the surface of the substrate.

As shown in FIG. 4(*b*), an insulation film of HTO, HLO(High Temperature Low Pressure Oxide), LTO(Low Temperature Oxide) or BPSG (Borophospho- Silicate Glass) is deposited on the thin nitride film 36, which is subjected to an etch back, forming side wall spacers 57 and 58 at both sides of the gate electrode 55.

Figure 4C:
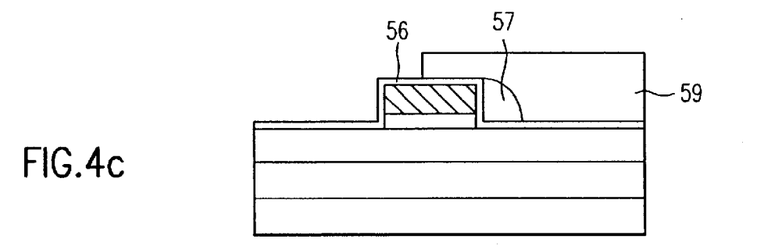

As shown in FIG. 4C, a photoresist film 59 is coated on the nitride film 56 and the sidewall spacers 57 and 58, which is subjected to a photo etching so as to expose the sidewall spacer formed at one sidewall of the gate electrode 55 and the exposed sidewall spacer 58 is removed using the photoresist film 59 as a mask.

Figure 4D:
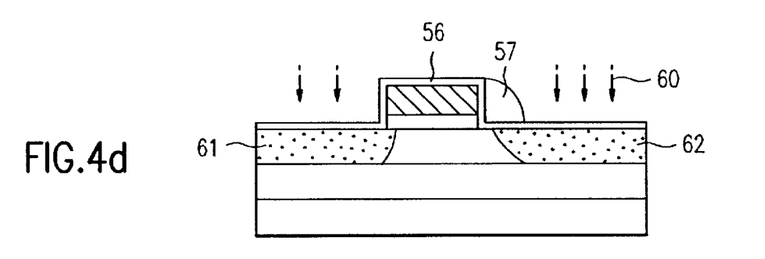

As shown in FIG. 4(d), p-type impurities 60 are ion injected using the side wall spacer 57 and gate electrode 55 as masks, forming a high density source region 61 and a high density drain region 62.

At this time, the drain region 62 is made to have a moderately sloped junction structure different from the source region 62 due to the masking of the side wall spacer 57 formed only at one side of the gate electrode 55 at the time of ion injection.

The sloped junction structure of the drain region 62 provides the same effect with an LDD structure.

Figure 4E:
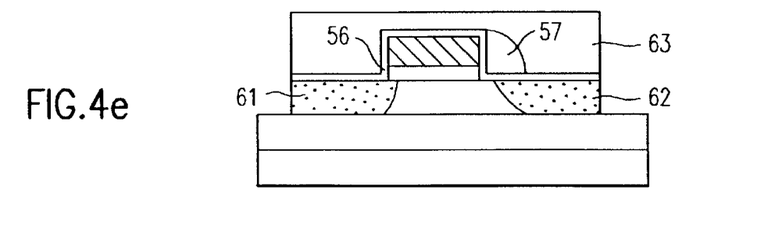

As shown in FIG. 4(e), patterning of the source 61 and the drain 62 with predetermined pattern with a photo etching process using the photoresist 20 yields a TFT having a upper gate of which drain region has a form of a slope.

Figure 5:
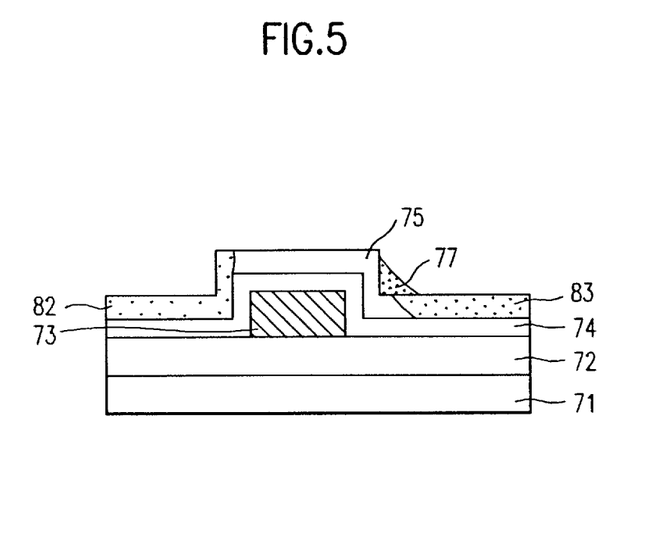
FIG. 5 shows a section of an offset TFT having bottom gate in accordance with another embodiment of this invention.

Shown in FIG. 5 is a section of an offset TFT having a bottom gate in accordance with another embodiment of this invention. Referring to FIG. 5, a TFT having a bottom gate in accordance with this invention includes a substrate 71, an insulation film 72 formed on the substrate 71, a gate electrode 73 formed on the central part of the insulation film 72, a gate insulation film 74 formed on the insulation film 72 surrounding the exposed surface of the gate electrode 73, a semiconductor layer 75 formed on the gate insulation film 74 except one side edge thereof, a side wall spacer 77 formed in the semiconductor layer 75 at one side of the gate electrode 73, high density impurity region 83 for drain having a sloped junction structure and formed overlapped with the side wall spacer 77 in the semiconductor layer 75 on one side of the gate electrode 73, and a high density impurity region 82 for source formed in the semiconductor layer 82 on the other side of the gate electrode 73.

Shown in FIG. 6(a) to 6(e) is a process for fabricating an offset TFT having a bottom gate in accordance with another embodiment of this invention.

Figure 6A:
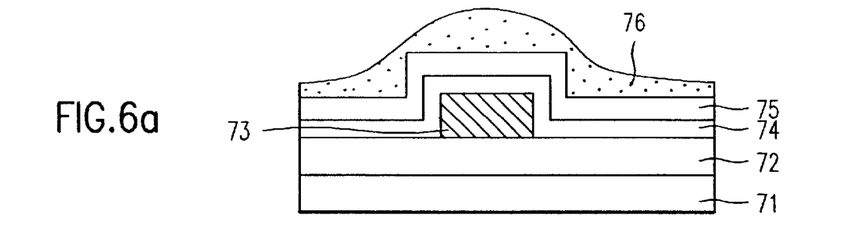

First, as shown in FIG. 6(a), an insulation film 72 of oxidation film and polysilicon are deposited successively on a substrate 71, which is subjected to a photo etching to form a gate electrode 73 having a fixed thickness on the central part of the insulation film 72.

A gate insulation film 74 is formed on the insulation film 72 surrounding the exposed surface of the gate electrode 73, and undoped polysilicon film or undoped amorphous film is deposited thereon, forming a semiconductor layer 75.

The semiconductor layer 75 and the gate insulation film 74 have steps as much as the thickness of the gate electrode 73 at the part the gate electrode 73.

To improve the characteristics of the semiconductor layer 75, silicon ions are injected into the semiconductor layer 75.

The silicon ion injection converts the semiconductor layer 75 of polysilicon film into amorphous silicon film.

Then, the semiconductor layer 75 having converted into amorphous silicon film is subjected to an annealing at a fixed temperature of 600±50 deg. C. for five hours or a laser annealing, converting it into a polysilicon film, again.

Then, to adjust threshold voltage Vt, impurity ions are ion injected into the semiconductor layer 75.

And a BPSG film is deposited on the semiconductor layer 75 as an insulation film 76 for the side wall spacer, which is subjected to a flowing.

In this time, it does not make and difference to coat sp in on glass instead of deposition of the BPSG film.

Figure 6B:
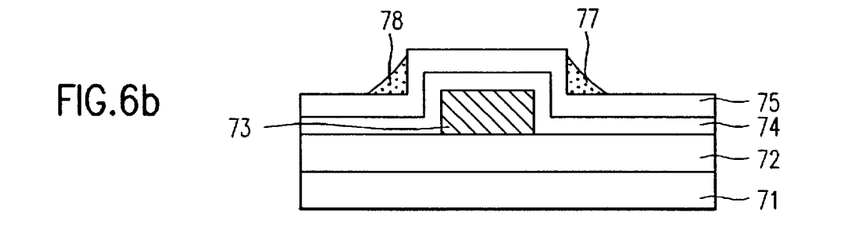

As shown in FIG. 6(b), the insulation film 76 is subjected to an etch back to form side wall spacers 77 and 78.

Spin on glass or BPSG is used for flowing material of the insulation film 76 used for forming the side wall spacers.

Figure 6C:
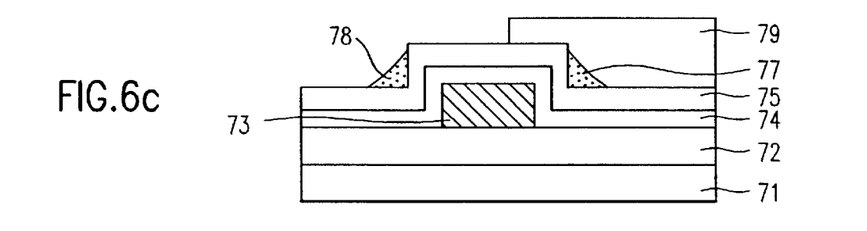

As shown in FIG. 6(c), a photoresist film 79 is coated on all over the surface of the substrate, which photoresist film 79 is subjected to a photo etching so as to expose the side wall spacer 78 formed only at one side of the gate electrode 73, and the exposed side wall spacer 78 is removed using the photoresist film 79 as a mask.

Figure 6D:
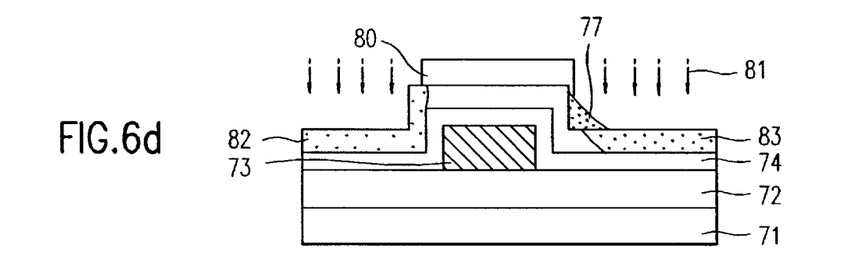

As shown in FIG. 6(d), after removing the side wall spacer, the photoresist film 79 is removed.

Another photoresist film 80 is coated on all over the surface of the substrate again, and a photo etching is carried out to leave the photoresist film 80 only above the gate electrode 73 and on part of the side wall spacer 77.

P-type impurities are ion injected using the photoresist film as a mask, forming a high density source region 82 and a high density drain region 83.

In this time, the side wall spacer 77 staying at one side of the gate electrode 73 serves as a mask at the time of ion injection, providing the high density drain region 83 below the side wall spacer 77 with a sloped junction structure which has the same effect with an LDD structure.

Figure 6E:
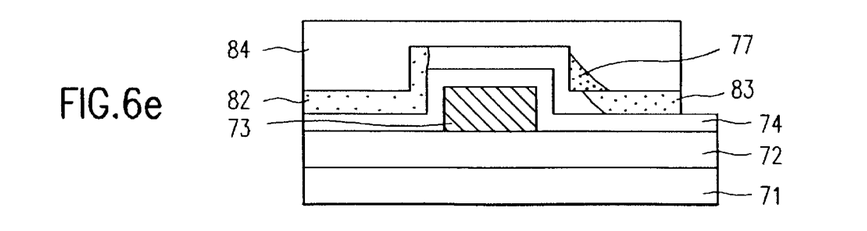

As shown in FIG. 6(e), carrying out of a photo etching process using the photoresist film 84, patterning the semiconductor layer 75, yields a TFT having a drain region with a sloped junction structure.

Figure 7:
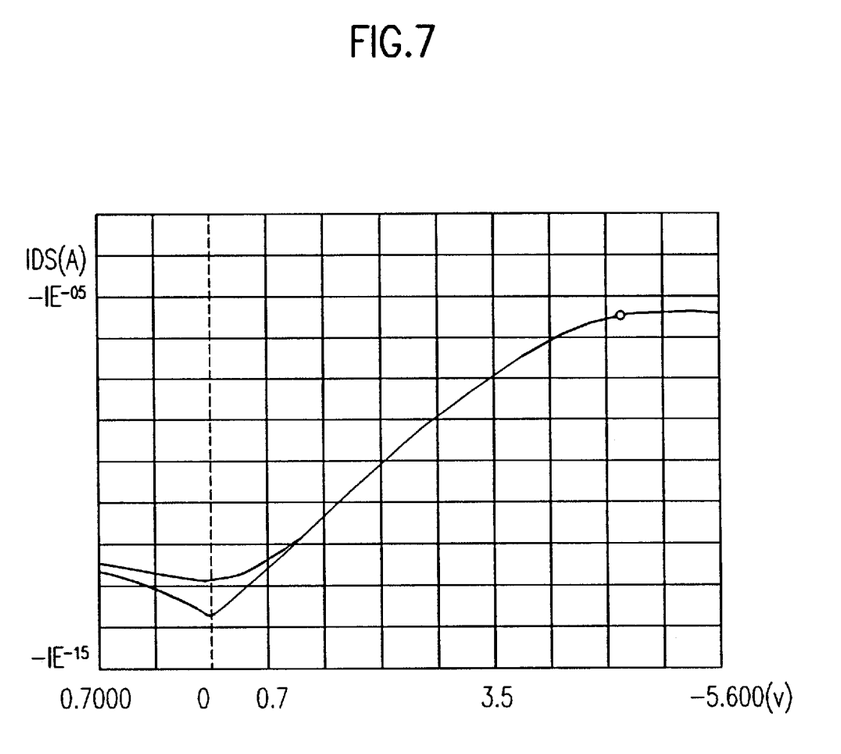
FIGS. 7 and 8 are graphs showing the characteristics of a conventional TFT and a TFT in accordance with this invention.

FIG. 7 is graphs showing the characteristics of a conventional LDO TFT and a TFT having a upper gate in accordance with one embodiment of this invention.

Referring to FIG. 7, in case of a TFT having W/L=0.6 *1.2 $\mu$m, an ion injection condition for forming a low density drain region being $5*10^{12}$ ions/cm2, BF2+, 25 KeV and ion injection condition for forming high density source/drain regions being $3*10^{14}$ ions/cm2, BF2+, 25 KeV, in a conventional LDO TFT, the off current is 515fA and on current is 103 nA, resulting in the on/off current ratio of $2*10^5$.

On the other hand, in a TFT in accordance with the first embodiment of this invention, the off current is 78 fA and the on current is 102 nA, resulting in the on/off current ratio of $1.5*10^6$.

And in case an average value of 75 point data be obtained, in a conventional LDO TFT the off current is 518 fA(deviation 1 $\sigma$=1.8%), and the on current is 101 nA(deviation 1 $\sigma$=1.2%), resulting in the on/off current ratio of $1.9*10^5$. In the TFT of the first embodiment, the off current is 71 fA (1 $\sigma$=1.7%), and on current is 100 nA(1 $\sigma$=1.5%), resulting in the on/off current ratio of $1.4*10^6$.

Figure 8:
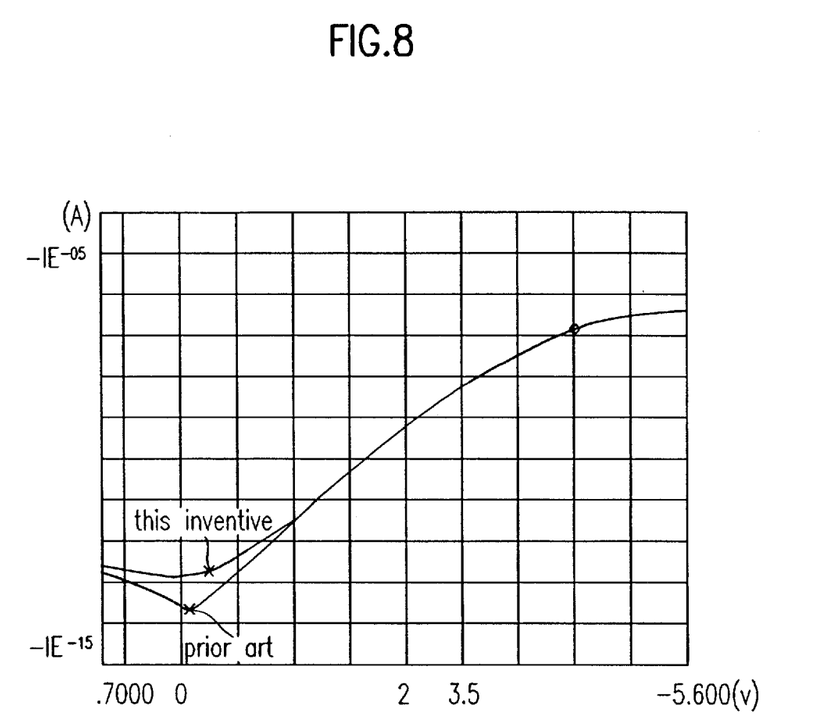

FIG. 8 is graphs showing the characteristics of a conventional TFT and a TFT having a bottom gate in accordance with another embodiment of this invention.

Under the same condition with above, the TFT of this invention has the off current of 68 fA, on current of 103 nA and on/off current ratio of $2*10^5$.

And in case an average value of 75 point data be obtained, the TFT of this invention exhibits an off current of 71 fA(1 $\sigma$=1.7%), on current of 100 fA(1 $\sigma$=1.5%), with the on/off current ratio of $1.4*10^6$.

In FIGS. 7 and 8, mark "o" represents an on current point, and mark "x" represents an off current point.

As explained in the foregoing description, a TFT in accordance with this invention can obtain an off current almost same with a conventional LDO TFT, but the off current thereof found to have a significant difference.

Accordingly, in FIGS. 7 and 8, the on current points of a conventional TFT and a TFT of this invention have been shown without difference, while the off current point have been shown with great difference.

Thus, a TFT in accordance with the embodiments of this invention decreases off current compared to a conventional LDO TFT, while maintains on current the same, providing to obtain an increased on/off current ratio.

As has been explained in foregoing description in detail, an offset TFT of this invention can obtain the same effect with a conventional LDD structure by forming a drain region having a sloped junction structure utilizing a side wall spacer as an ion injection mask.

Accordingly, an offset TFT of this invention can improve electric characteristics of an element significantly by reducing off current and maintaining on current to the same level with a conventional offset LDD TFT, making to have an on/off current ratio increased 7 to 14 time higher, and can simplify the process because the conventional LDD forming process causing the problem of over lay margin is not required.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A thin film transistor comprising:
    a substrate;
    a gate electrode formed on a central part of the substrate;
    a semiconductor layer formed to surround the gate electrode on the substrate;
    a side wall spacer formed at only one side of the gate electrode on the semiconductor layer; and
    high density impurity regions formed in the semiconductor layer on both sides of the gate electrode.

2. The thin film transistor as claimed in claim 1, wherein the gate pole is of polysilicon film.

3. The thin film transistor as claimed in claim 1, wherein the semiconductor layer is of polysilicon film.

4. The thin film transistor as claimed in claim 1, wherein the semiconductor layer is of amorphous silicon film.

5. The thin film transistor as claimed in claim 1, wherein the side wall spacer is of insulation film.

6. A thin film transistor comprising:
    a substrate;
    an insulation film formed on the substrate;
    a gate electrode formed on a central part of the insulation film;
    a gate insulation film formed on the insulation film surrounding the gate electrode;
    a semiconductor layer formed on the gate insulation film;
    a side wall spacer formed at only one side of the gate electrode on the semiconductor layer; and
    high density impurity regions formed in the semiconductor layer on both sides of the gate electrode and having a sloped junction structure under the side wall spacer on one side of the gate electrode.

7. The thin film transistor as claimed in claim 6, wherein the gate pole is of polysilicon film.

8. The thin film transistor as claimed in claim 6, wherein the semiconductor layer is of polysilicon film.

9. The thin film transistor as claimed in claim 6, wherein the semiconductor layer is of amorphous silicon film.

10. The thin film transistor as claimed in claim 6, wherein the side wall spacer is of insulation film.

11. The thin film transistor as claimed in claim 6, wherein the insulation film is of oxidation film.

12. The thin film transistor as claimed in claim 6, wherein the gate insulation film is of oxidation film.

13. A thin film transistor comprising:
    a substrate;
    a semiconductor layer formed on the substrate;
    a gate electrode formed on a central part of the semiconductor layer;
    a side wall spacer formed at only one side of the gate electrode on the semiconductor layer; and
    high density impurity regions formed in the semiconductor layer on both sides of the gate electrode.

14. The thin film transistor as claimed in claim 13, wherein the semiconductor layer is of polysilicon film.

15. The thin film transistor as claimed in claim 13, wherein the semiconductor layer is of amorphous silicon film.

16. The thin film transistor as claimed in claim 13, wherein the gate pole is of polysilicon film.

17. The thin film transistor as claimed in claim 13, wherein the side wall spacer is of insulation film.

18. A thin film transistor comprising:
    a substrate;
    a first insulation film formed on the substrate;
    a semiconductor layer formed on the first insulation film;
    a gate insulation film formed on a central part of the semiconductor layer;
    a gate electrode formed on the gate insulation film;
    a second insulation film formed on the semiconductor layer surrounding the gate electrode;
    a side wall spacer formed at only one side of the gate electrode on the second insulation film; and
    high density impurity regions formed in the semiconductor layer on both sides of the gate electrode and having a sloped junction structure under the side wall spacer on one side of the gate electrode.

19. The thin film transistor as claimed in claim 18, wherein the semiconductor layer is of polysilicon film.

20. The thin film transistor as claimed in claim 18, wherein the semiconductor layer is of amorphous silicon film.

21. The thin film transistor as claimed in claim 18, wherein the gate pole is of polysilicon film.

22. The thin film transistor as claimed in claim 18, wherein the side wall spacer is of insulation film.

23. The thin film transistor as claimed in claim 18, wherein the first insulation film is of oxidation film.

24. The thin film transistor as claimed in claim 18, wherein the gate insulation film is of oxidation film.

25. The thin film transistor as claimed in claim 18, wherein the second insulation film is a nitride film.

* * * * *